(12) United States Patent
Wu et al.

(10) Patent No.: US 12,009,464 B2
(45) Date of Patent: Jun. 11, 2024

(54) DISPLAY DEVICE AND MANUFACTURING METHOD THEREOF

(71) Applicant: Au Optronics Corporation, Hsinchu (TW)

(72) Inventors: Wei-Fu Wu, Hsinchu (TW); Yu Tseng, Hsinchu (TW); Yu-Ting Liu, Hsinchu (TW); Chih-Cheng Kao, Hsinchu (TW); Tsai-Chi Yeh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 423 days.

(21) Appl. No.: 17/515,558

(22) Filed: Nov. 1, 2021

(65) Prior Publication Data
US 2023/0050951 A1  Feb. 16, 2023

(30) Foreign Application Priority Data
Aug. 6, 2021  (TW) .................................. 110129180

(51) Int. Cl.
| | |
|---|---|
| *H01L 33/62* | (2010.01) |
| *G02F 1/1345* | (2006.01) |
| *H01L 23/538* | (2006.01) |
| *H01L 25/075* | (2006.01) |
| *H01L 33/00* | (2010.01) |

(52) U.S. Cl.
CPC .......... *H01L 33/62* (2013.01); *G02F 1/13452* (2013.01); *H01L 23/5387* (2013.01); *H01L 25/0753* (2013.01); *H01L 33/005* (2013.01); *H01L 2933/0066* (2013.01)

(58) Field of Classification Search
CPC ... G02F 1/13452; H01L 33/62; H01L 25/167; H01L 33/005; H01L 23/5387; H01L 25/0753; H01L 2933/0066; H05K 1/189; H05K 1/147; H05K 2201/056; H05K 2201/0129; H05K 2201/10128
See application file for complete search history.

(56) References Cited

U.S. PATENT DOCUMENTS 8,330,734 B2 * 12/2012 Oohira ................. G06F 3/0412
345/173
9,793,330 B2  10/2017 Li
(Continued)

FOREIGN PATENT DOCUMENTS

| CN | 104851892 | 8/2015 |
| CN | 211455148 | 9/2020 |

(Continued)

*Primary Examiner* — Vinh T Lam
(74) *Attorney, Agent, or Firm* — JCIPRNET

(57) ABSTRACT

A display device includes a pixel array substrate and a circuit board. The pixel array substrate has a first surface, a second surface opposite to the first surface, and a first side surface connecting the first surface and the second surface. Multiple bonding pads are located on the first surface. The circuit board is bent from above the first surface of the pixel array substrate to below the second surface. The circuit board is electrically connected to the bonding pads and includes a thermoplastic substrate. The thermoplastic substrate includes a third surface facing the pixel array substrate and a fourth surface opposite to the third surface. The thermoplastic substrate includes a first bend formed by thermoplastics.

20 Claims, 16 Drawing Sheets

(56) References Cited

U.S. PATENT DOCUMENTS

| | | | |
|---|---|---|---|
| 9,899,330 B2 * | 2/2018 | Dalal | H01L 24/00 |
| 9,960,512 B2 * | 5/2018 | Kato | H01R 12/78 |
| 10,032,842 B2 | 7/2018 | Li | |
| 10,459,554 B2 * | 10/2019 | Funayama | G02F 1/13452 |
| 10,509,278 B2 | 12/2019 | Cheng et al. | |
| 10,952,356 B2 * | 3/2021 | Qi | H05K 9/0054 |
| 11,096,288 B2 * | 8/2021 | Vella | H05K 1/0393 |
| 11,112,636 B2 * | 9/2021 | Fan | G02F 1/133512 |
| 11,212,914 B2 * | 12/2021 | Shu | H05K 1/189 |
| 11,256,299 B2 * | 2/2022 | Lee | H05K 1/0259 |
| 11,272,613 B2 * | 3/2022 | Min | H05K 1/0237 |
| 11,340,484 B2 * | 5/2022 | Katagiri | G02F 1/133305 |
| 11,468,832 B2 * | 10/2022 | Zhu | G09F 9/30 |
| 11,519,564 B2 * | 12/2022 | Yao | F21K 9/232 |
| 11,527,597 B2 * | 12/2022 | Hwang | H10K 59/131 |
| 11,537,179 B2 * | 12/2022 | Xie | G06F 1/1637 |
| 11,602,053 B2 * | 3/2023 | Eom | H01L 24/32 |
| 11,631,732 B2 * | 4/2023 | Song | H10K 77/111 |
| | | | 257/40 |
| 11,714,512 B2 * | 8/2023 | Son | H05K 1/028 |
| | | | 345/173 |
| 11,764,540 B2 * | 9/2023 | Costi | H01S 5/02476 |
| | | | 174/254 |
| 2008/0195817 A1 * | 8/2008 | Hiew | H05K 3/284 |
| | | | 711/115 |
| 2018/0284913 A1 * | 10/2018 | Reynolds | H05K 1/0201 |
| 2018/0308799 A1 * | 10/2018 | Dalal | H01L 24/92 |
| 2020/0137888 A1 | 4/2020 | Liu et al. | |
| 2020/0142237 A1 * | 5/2020 | Zheng | H05K 1/147 |
| 2020/0146140 A1 * | 5/2020 | Lim | H01L 24/16 |
| 2020/0253056 A1 | 8/2020 | Liu et al. | |
| 2020/0404788 A1 | 12/2020 | Xiong et al. | |
| 2021/0037646 A1 * | 2/2021 | Xiao | H05K 1/189 |
| 2021/0109389 A1 * | 4/2021 | Fan | G02F 1/1362 |
| 2021/0157374 A1 | 5/2021 | Choi et al. | |
| 2021/0193790 A1 * | 6/2021 | Hu | H01L 27/124 |
| 2021/0296394 A1 * | 9/2021 | Meng | H01L 27/156 |
| 2022/0075430 A1 * | 3/2022 | Im | G06F 1/183 |

FOREIGN PATENT DOCUMENTS

| | | |
|---|---|---|
| CN | 112825325 | 5/2021 |
| TW | 201928461 | 7/2019 |
| TW | 202017448 | 5/2020 |
| TW | I734508 | 7/2021 |

\* cited by examiner

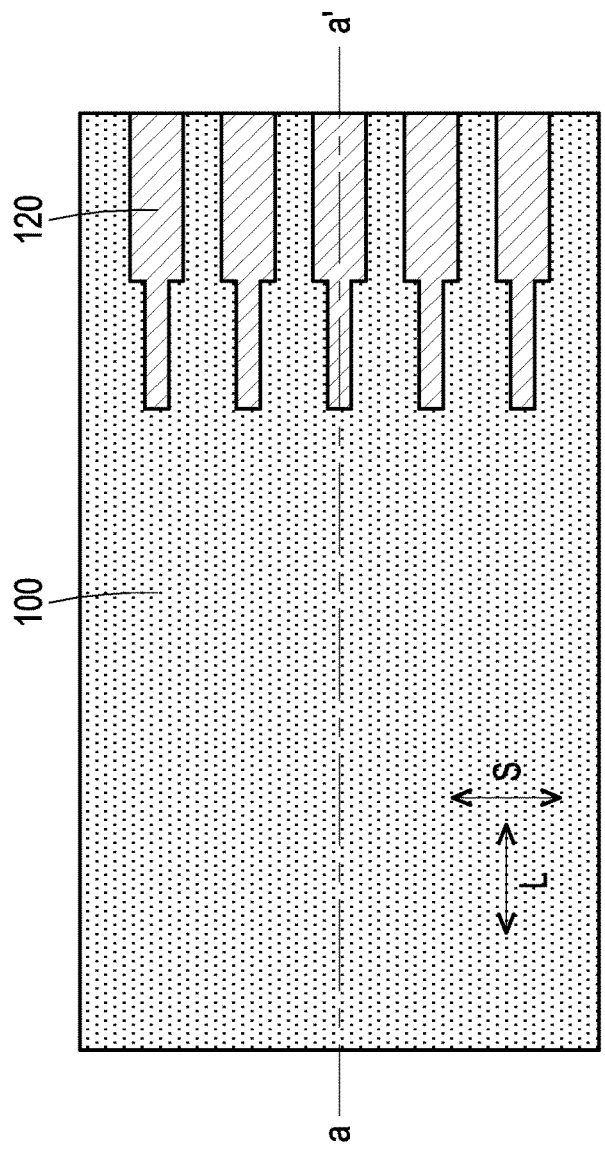
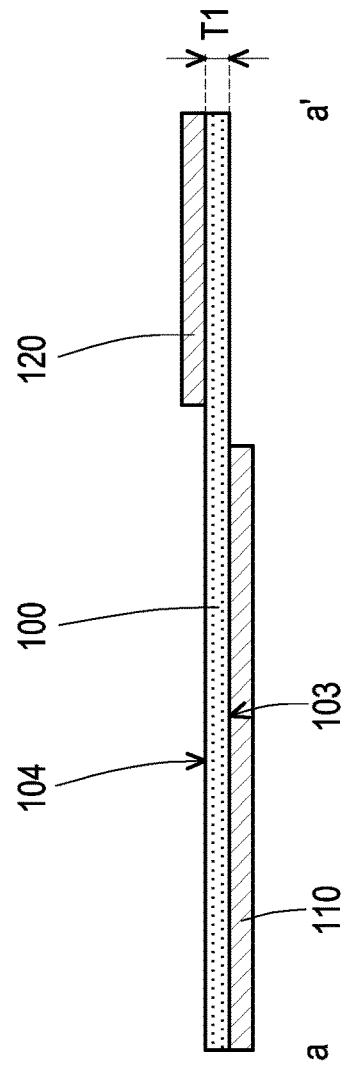
FIG. 1A
FIG. 1B

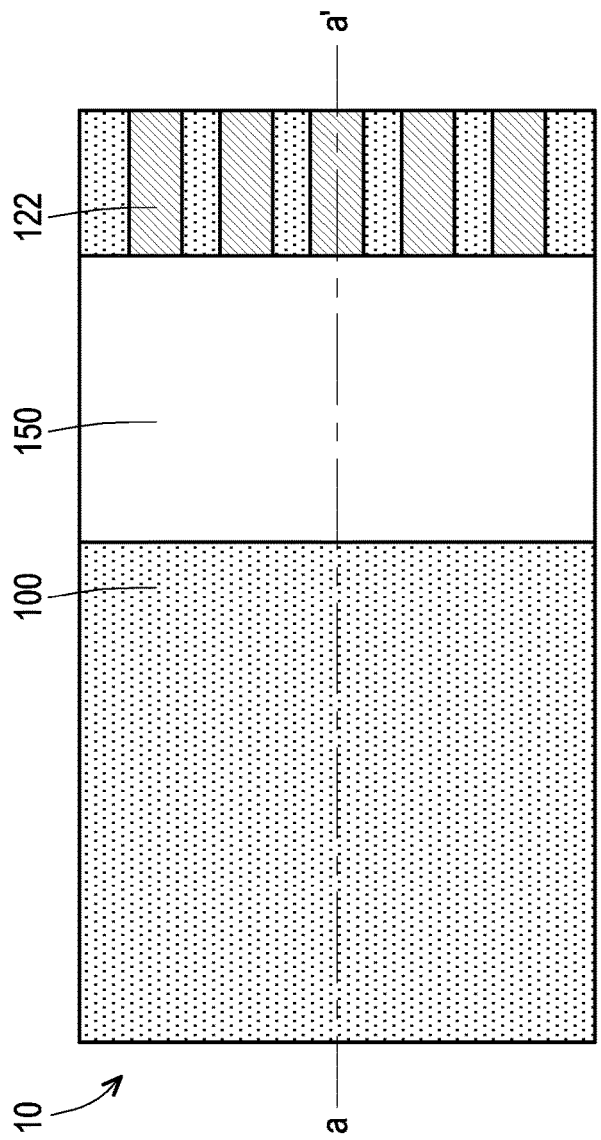
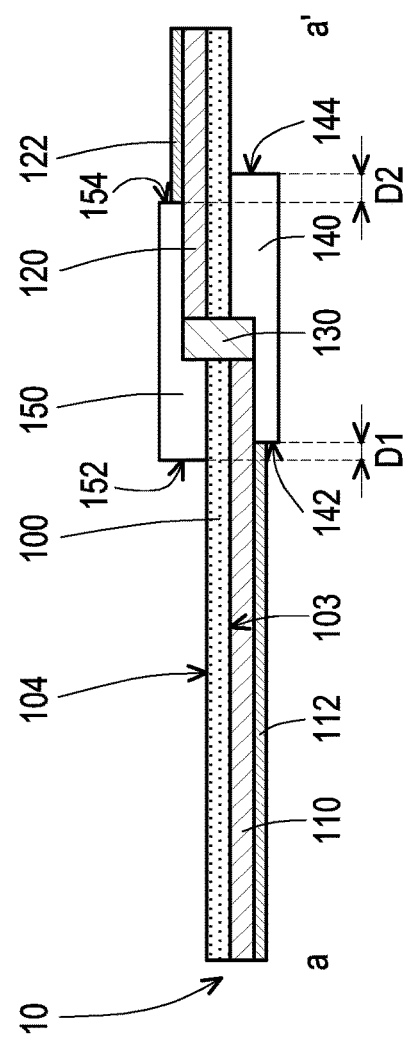
FIG. 4A
FIG. 4B

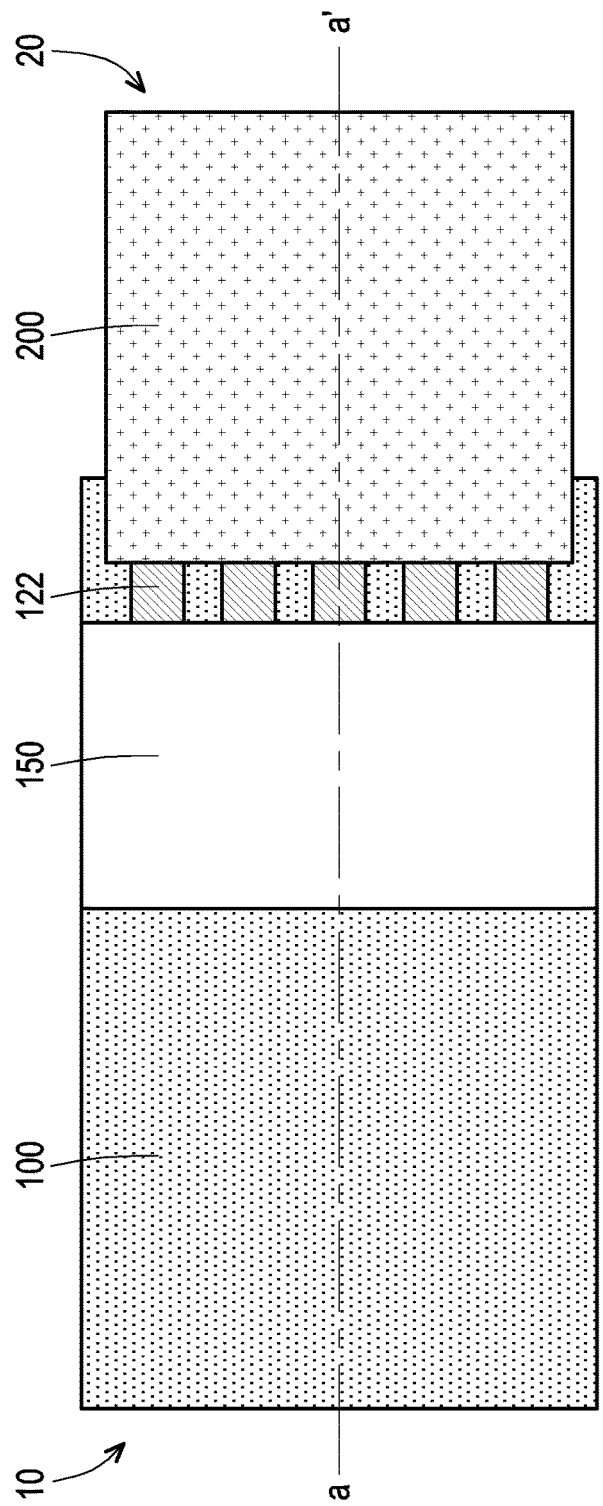
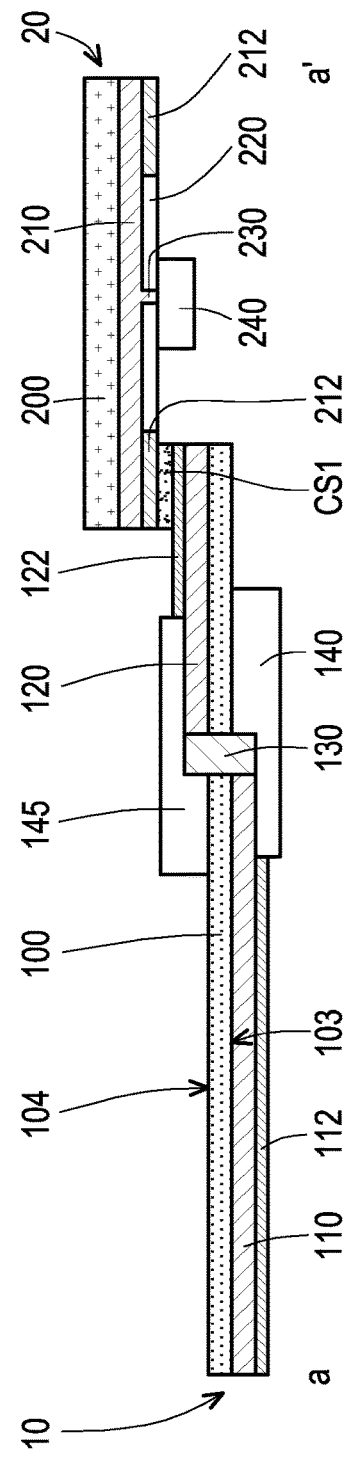
FIG. 5A
FIG. 5B

DISPLAY DEVICE AND MANUFACTURING METHOD THEREOF

CROSS-REFERENCE TO RELATED APPLICATION

This application claims the priority benefit of Taiwan application serial no. 110129180, filed on Aug. 6, 2021. The entirety of the above-mentioned patent application is hereby incorporated by reference herein and made a part of this specification.

BACKGROUND

Technical Field

The disclosure relates to a display device and a manufacturing method thereof.

Description of Related Art

Chip on Film (COF) packaging is an integrated chip packaging technology. Specifically, an integrated chip and other electronic components are packaged on a flexible printed circuit film, thereby forming a chip-on-film package structure. The chip-on-film package structure has the advantages of fast production, flexibility, high wiring density, and light weight. Therefore, the chip-on-film package structure is often used in spliced display devices. Generally, a spliced display device is formed by splicing many pixel array substrates with each other. Chips of these pixel array substrates are usually disposed in chip-on-film package structures and are bent from the front surfaces of the pixel array substrates to the back surfaces of the pixel array substrates.

SUMMARY

The disclosure provides a display device which avoids the problem of a circuit board protruding from a side of a pixel array substrate.

The disclosure provides a manufacturing method of a display device, which avoids the problem of a circuit board protruding from a side of a pixel array substrate.

At least one embodiment of the disclosure provides a display device. The display device includes a pixel array substrate and a circuit board. The pixel array substrate has a first surface, a second surface opposite to the first surface, and a first side surface connecting the first surface and the second surface. Multiple bonding pads are located on the first surface. The circuit board is electrically connected to the bonding pads and is bent from above the first surface of the pixel array substrate to below the second surface. The circuit board includes a thermoplastic substrate. The thermoplastic substrate includes a third surface facing the pixel array substrate and a fourth surface opposite to the third surface. The thermoplastic substrate includes a first bend formed by thermoplastics.

At least one embodiment of the disclosure provides a manufacturing method of a display device. The manufacturing method of the display device includes the following. A pixel array substrate is provided. The pixel array substrate has a first surface, a second surface opposite to the first surface, and a first side surface connecting the first surface and the second surface, and multiple bonding pads are located on the first surface. A circuit board is provided. The circuit board includes a thermoplastic substrate. The thermoplastic substrate is heated to form a first bend formed by thermoplastics in the thermoplastic substrate. The circuit board is electrically connected to the bonding pads.

BRIEF DESCRIPTION OF THE DRAWINGS

FIGS. 1A to 5A are top schematic views of a manufacturing method of a circuit board according to an embodiment of the disclosure.

FIGS. 1B to 5B are schematic cross-sectional views taken along a sectional line a-a' of FIGS. 1A to 5A, respectively.

FIGS. 6 to 8A are schematic cross-sectional views of a manufacturing method of a display device according to an embodiment of the disclosure.

DESCRIPTION OF THE EMBODIMENTS

Figure 2A:
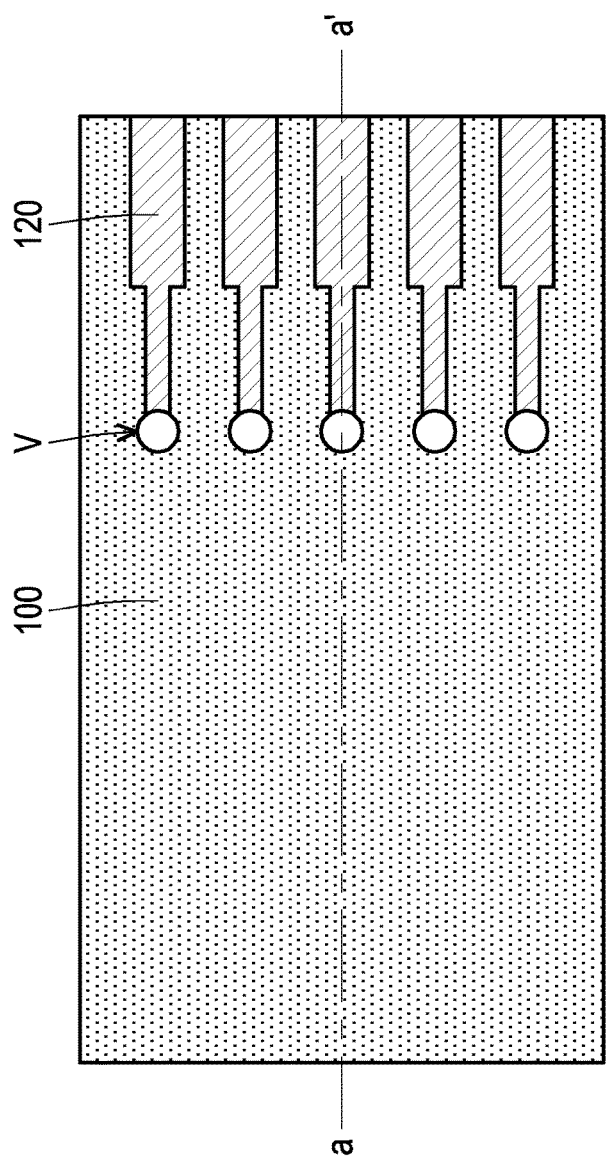

FIGS. 1A to 5A are top schematic views of a manufacturing method of a circuit board according to an embodiment of the disclosure. FIGS. 1B to 5B are schematic cross-sectional views taken along a sectional line a-a' of FIGS. 1A to 5A, respectively.

Referring to FIGS. 1A and 1B, a thermoplastic substrate 100 is formed. A thickness T1 of the thermoplastic substrate 100 is, for example, 25 micrometers to 50 micrometers. In this embodiment, the thermoplastic substrate 100 includes a liquid crystal polymer substrate. Generally, a liquid crystal polymer (LCP) can be divided into TYPE I, TYPE II, and TYPE III according to the heat resistance. In some exemplary embodiments, a TYPE-III liquid crystal polymer is used for the thermoplastic substrate 100, and the glass transition temperature is 145° C. to 165° C.

In some embodiments, the thermoplastic substrate 100 contains the liquid crystal polymer as shown in Chemical equation 1.

Chemical equation 1

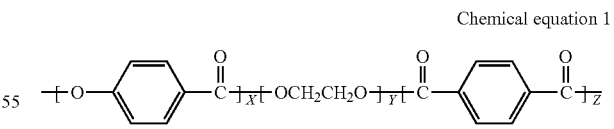

In Chemical equation 1, X, Y, and Z are positive integers. The heat deflection temperature (HDT) of the liquid crystal polymer of Chemical equation 1 is less than 230° C., and the melting point is about 240° C.

In some embodiments, the liquid crystal molecules in the thermoplastic substrate 100 have a long axis direction L and a short axis direction S. In some embodiments, the long axis direction L of the liquid crystal molecules in the thermoplastic substrate 100 are parallel to each other (or the deviation angle is less than 90 degrees).

Still referring to FIGS. 1A and 1B, the thermoplastic substrate 100 includes a first surface 103 and a second surface 104 opposite to the first surface 103.

A first conducting pattern 110 is formed on the first surface 103 of the thermoplastic substrate 100. For example, a conductive film (such as copper foil) is pressed onto the first surface 103 of the thermoplastic substrate 100. Next, the aforementioned conductive film is etched to form the first conducting pattern 110. However, the disclosure is not limited thereto. The first conducting pattern 110 may also be deposited on the thermoplastic substrate 100 by electroplating, electroless plating, sputtering or other methods. In some embodiments, other adhesive materials are included between the first conducting pattern 110 and the thermoplastic substrate 100, but the disclosure is not limited thereto.

A second conducting pattern 120 is formed on the second surface 104 of the thermoplastic substrate 100. For example, a conductive film (such as copper foil) is pressed onto the second surface 104 of the thermoplastic substrate 100. Next, the aforementioned conductive film is etched to form the second conducting pattern 120. However, the disclosure is not limited thereto. The second conducting pattern 120 may also be deposited on the thermoplastic substrate 100 by electroplating, electroless plating, sputtering or other methods. In some embodiments, other adhesive materials are included between the second conducting pattern 120 and the thermoplastic substrate 100, but the disclosure is not limited thereto.

In some embodiments, the first conducting pattern 110 and the second conducting pattern 120 are rolled copper foil, and the thickness is 12 micrometers to 18 micrometers, but the disclosure is not limited thereto.

Figure 2B:
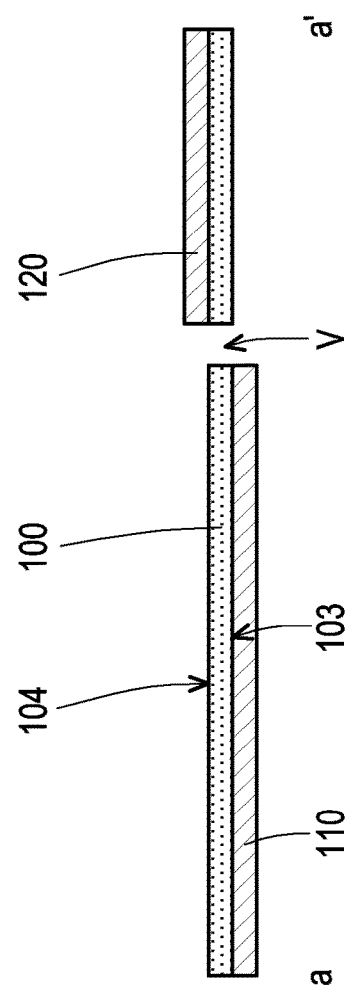

Referring to FIGS. 2A and 2B, a plurality of vias V are formed in the thermoplastic substrate 100. The Via V runs through the thermoplastic substrate 100. In some embodiments, the method for forming the via V includes laser, drilling, or other suitable methods.

Figure 3A:
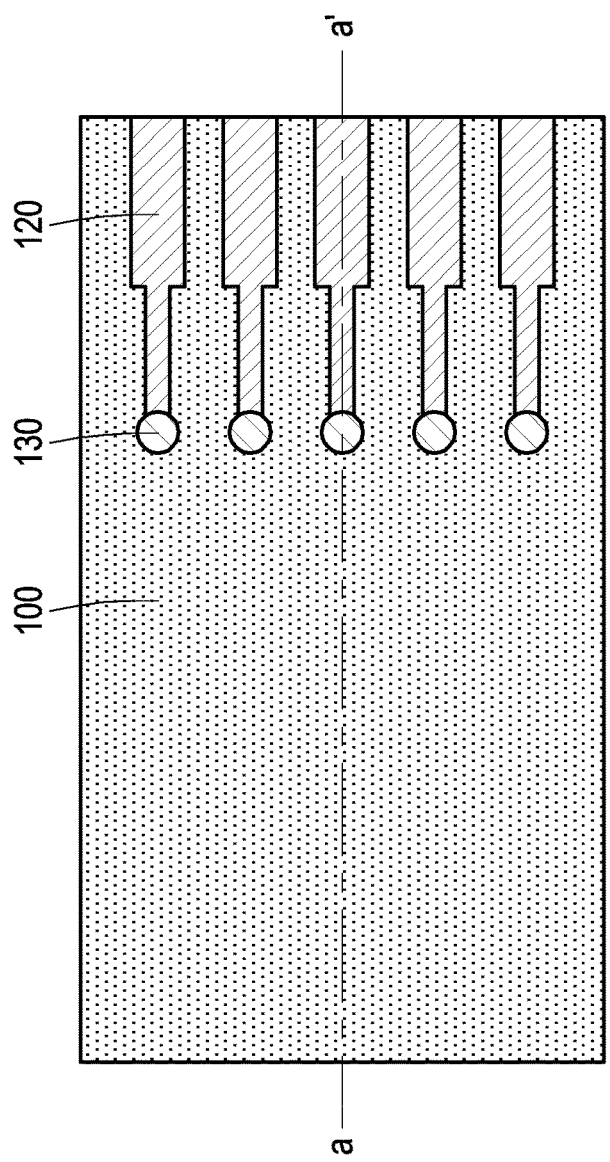
Figure 3B:
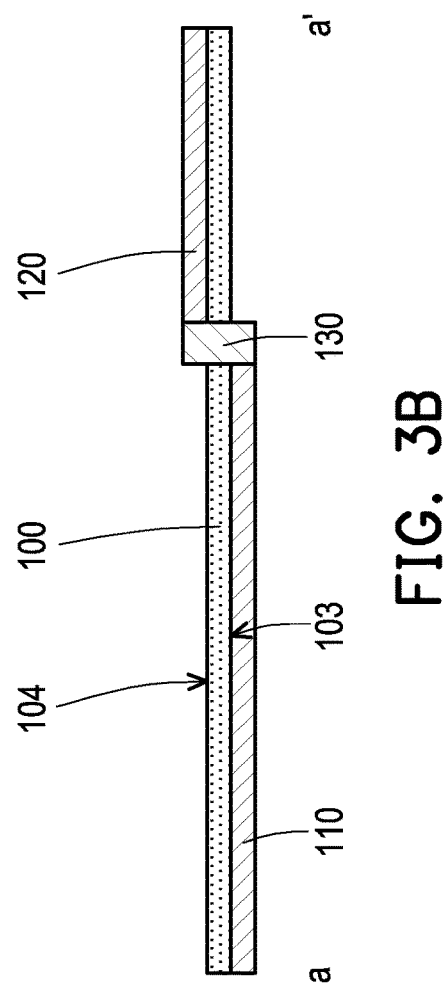

Referring to FIGS. 3A and 3B, conductive materials are formed in the vias V to form a plurality of electric conductive vias 130. The electric conductive via 130 electrically connects the first conducting pattern 110 to the second conducting pattern 120. In some embodiments, the method for forming the conductive material in via V includes electroplating, electroless plating, or other suitable methods.

Referring to FIGS. 4A and 4B, a first protective layer 140 is formed on the first conducting pattern 110. The first protective layer 140 does not completely cover the first surface 103 of the thermoplastic substrate 100 and the first conducting pattern 110. A first oxidation resistant layer 112 is formed on the first conducting pattern 110 exposed by the first protective layer 140. For example, the first protective layer 140 exposes a bonding pad of the first conducting pattern 110, and the first oxidation resistant layer 112 is formed on the bonding pad of the first conducting pattern 110.

A second protective layer 150 is formed on the second conducting pattern 120. The second protective layer 150 does not completely cover the second surface 104 of the thermoplastic substrate 100 and the second conducting pattern 120. A second oxidation resistant layer 122 is formed on the second conducting pattern 120 exposed by the second protective layer 150. For example, the second protective layer 150 exposes a bonding pad of the second conducting pattern 120, and the second oxidation resistant layer 122 is formed on the bonding pad of the second conducting pattern 120.

In some embodiments, the first protective layer 140 and the second protective layer 150 may improve the stiffness of the circuit board and reduce wrinkles of the circuit board. The first protective layer 140 and the second protective layer 150 are, for example, solder resist inks (SR). In some embodiments, the thickness of the first protective layer 140 and the second protective layer 150 is 15 micrometers to 20 micrometers.

In some embodiments, the first oxidation resistant layer 112 and the second oxidation resistant layer 122, for example, each include a stacked layer of gold, palladium, nickel/gold or other materials that may prevent oxidation of the first conducting pattern 110 and the second conducting pattern 120. In some embodiments, each of the first oxidation resistant layer 112 and the second oxidation resistant layer 122 is a stacked layer of an electroplated gold layer and an electroplated nickel layer, the thickness of the electroplated gold layer is 0.03 micrometers to 0.19 micrometers, and the thickness of the electroplated nickel layer is 2 micrometers to 6 micrometers.

In some embodiments, a horizontal spacing D1 between a side surface 142 of the first protective layer 140 and a side surface 152 of the second protective layer 150 on one side is greater than or equal to 500 micrometers. A horizontal spacing D2 between a side surface 144 of the first protective layer 140 and a side surface 154 of the second protective layer 150 on another side is greater than or equal to 500 micrometers. By allowing the horizontal spacing D1 and the horizontal spacing D2 to be greater than or equal to 500 micrometers, the first conducting pattern 110 and the second conducting pattern 120 may be prevented from breaking due to stress concentration during bending.

In this embodiment, a circuit board 10 includes the thermoplastic substrate 100, the first conducting pattern 110, the second conducting pattern 120, the electric conductive via 130, the first protective layer 140, the second protective layer 150, the first oxidation resistant layer 112, and the second oxidation resistant layer 122.

Referring to FIGS. 5A and 5B, a chip package structure 20 is provided on the circuit board 10. In this embodiment, since the circuit board 10 is a dual-surface circuit board, the chip package structure 20 may be bonded to the circuit board 10 without additional flipping.

The chip package structure 20 is, for example, a chip on film (COF) package structure, a chip on glass (COG) package structure, a tape carrier package (TCP), or other forms of chip package structure. In this embodiment, the chip package structure 20 includes a substrate 200, a circuit 210, an insulating layer 220, and at least one chip 240.

The substrate 200 is, for example, polyimide (PI), polyethylene terephthalate (PET), a liquid crystal polymer, glass, or other suitable substrates. The substrate 200 may be a single-layer or a multilayer structure.

The circuit 210 is formed on the substrate 200. For example, a conductive film (such as copper foil) is pressed onto the substrate 200. Next, the aforementioned conductive film is etched to form the circuit 220. However, the disclosure is not limited thereto. The circuit 210 may also be deposited on the substrate 200 by electroplating, electroless plating, sputtering or other methods. In some embodiments, another adhesive material is included between the circuit 210 and the substrate 200, but the disclosure is not limited thereto. In some embodiments, another circuit (not shown) is formed on another side of the substrate 200 opposite to the circuit 210 to derive a dual-surface circuit board.

The insulating layer 220 is formed on the circuit 210. The insulating layer 220 is, for example, solder resist ink, or other suitable insulating layers. A conductive protective layer 212 is formed on the circuit 210 exposed by the insulating layer 220. For example, the insulating layer 220 exposes a bonding pad of the circuit 210, and the conductive protective layer 212 is formed on the bonding pad of the circuit 210. In some embodiments, the conductive protective layer 212 is a tin layer or other materials adapted for protecting the bonding pad of the circuit 210.

The chip 240 is located on the insulating layer 220 and is electrically connected to the circuit 210 through a conductive via 230 penetrating the insulating layer 220. In some embodiments, the chip package structure 20 includes more than one chip.

The chip package structure 20 is electrically connected to the second conducting pattern 120. In this embodiment, the chip package structure 20 is electrically connected to the second conducting pattern 120 through a first conductive bonding structure CS1. The first conductive bonding structure CS1 is, for example, an anisotropic conductive film (ACF), solder, or other suitable materials.

FIGS. 6 to 8A are schematic cross-sectional views of a manufacturing method of a display device according to an embodiment of the disclosure. FIG. 8B is a top schematic view of the display device of FIG. 8A.

Figure 6:
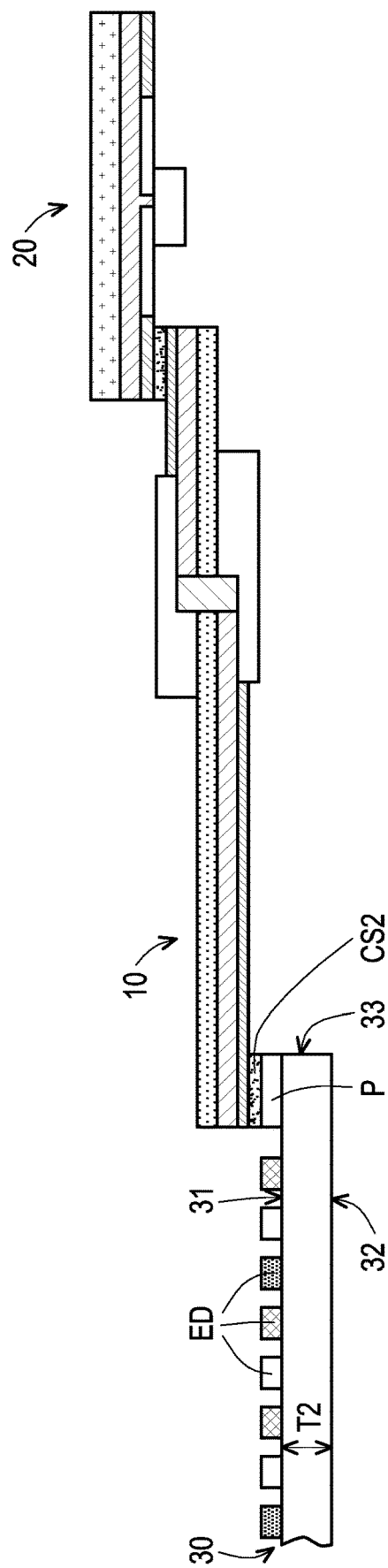

Referring to FIG. 6, a pixel array substrate 30 is provided. The pixel array substrate 30 includes, for example, an active element array (not shown). The pixel array substrate 30 has a first surface 31, a second surface 32 opposite to the first surface 31, and a first side surface 33 connecting the first surface 31 and the second surface 32. In some embodiments, a substrate thickness T2 (for example, the thickness of the glass substrate) of the pixel array substrate 30 is, for example, 0.1 micrometers to 0.7 micrometers.

In this embodiment, the pixel array substrate 30 includes a light-emitting element ED of the array. The light-emitting element ED is located on the first surface 31 or the second surface 32 of the pixel array substrate 30. The light-emitting element ED includes light-emitting elements of different colors, for example. The light-emitting element ED is, for example, a micro light-emitting diode, and the pixel array substrate 30 is adapted for a micro light-emitting diode display device, but the disclosure is not limited thereto. In other embodiments, the pixel array substrate is adapted for a liquid crystal display device, an organic light-emitting diode display device, or other types of display devices.

A plurality of bonding pads P are located on the first surface 31 of the pixel array substrate 30. The circuit board 10 is electrically connected to the bonding pad P. In this embodiment, the circuit board 10 is electrically connected to the bonding pad P through a second conductive bonding structure CS2. The second conductive bonding structure CS2 is, for example, an anisotropic conductive glue, solder, or other suitable materials.

In some embodiments, after the circuit board 10 is electrically connected to the bonding pad P, the chip package structure 20 is electrically connected to the circuit board 10. Specifically, after the circuit board 10 is electrically connected to the bonding pad P, and before the circuit board 10 is bent, the second conducting pattern 120 of the circuit board 10 faces upwards. At this time, the chip package structure 20 may be electrically connected to the circuit board 10 without turning the circuit board 10 over.

Figure 7:
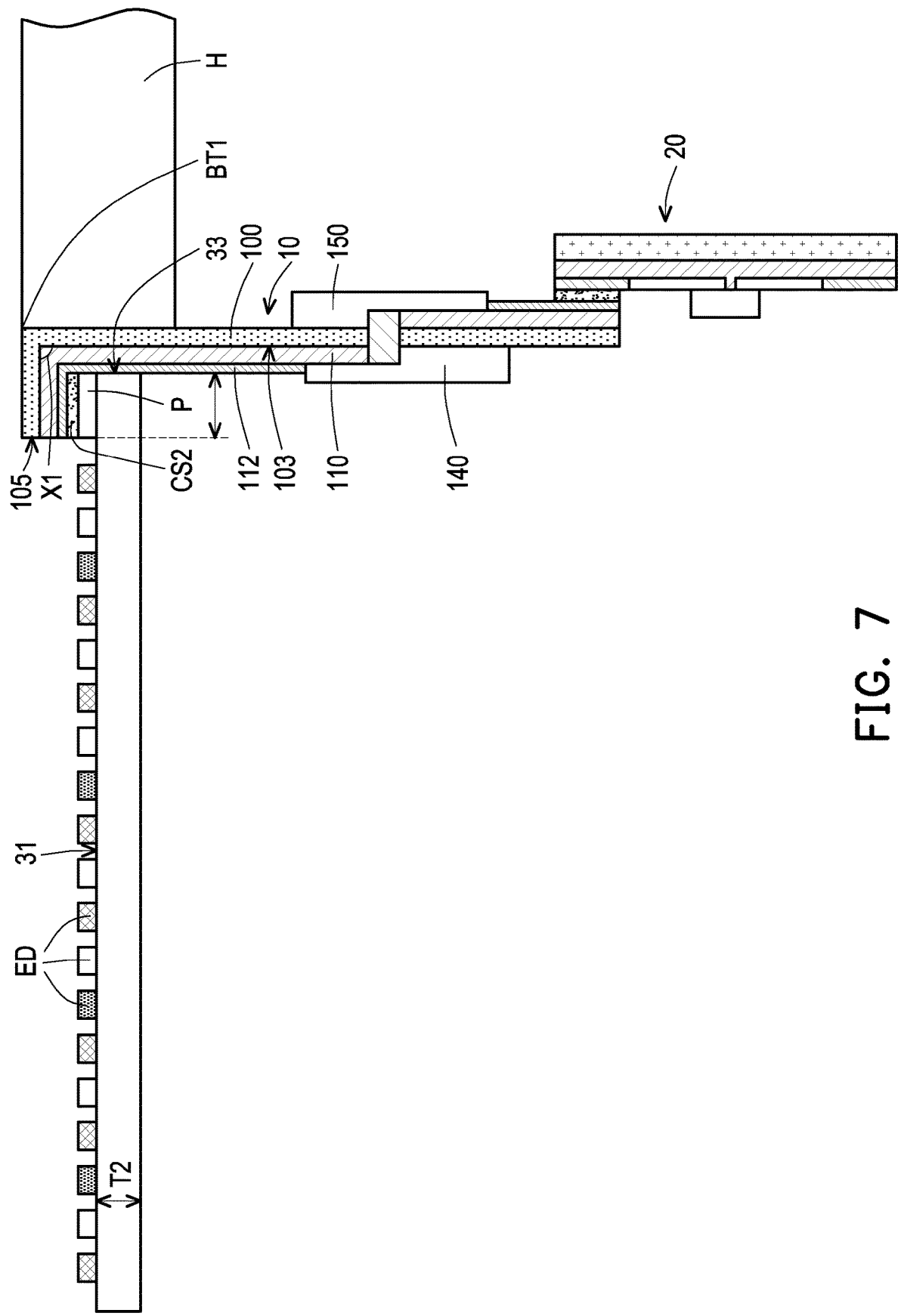

Referring to FIG. 7, the thermoplastic substrate 100 of the circuit board 10 is heated to form a first bend BT1 formed by thermoplastics in the thermoplastic substrate 100. In some embodiments, the first bend BT1 allows the circuit board 10 bend from above the first surface 31 of the pixel array substrate 30 to the first side surface 33. The first bend BT1 allows the thermoplastic substrate 100 to face the first surface 103 of the pixel array substrate 30 to have a bending angle X1. The bending angle X1 is, for example, 90 degrees to 135 degrees. In some embodiments, the Young's modulus of the first bend BT1 of the thermoplastic substrate 100 is 3 GPa to 5 GPa.

For example, after the circuit board 10 is electrically connected to the bonding pad P, the circuit board 10 is bent from above the first surface 31 of the pixel array substrate 30 to the first side surface 33. Next, the thermoplastic substrate 100 is heated with a thermal compression head H. In some embodiments, a TYPE-III liquid crystal polymer is used for the thermoplastic substrate 100, and the temperature of the thermal compression head H is 100° C. to 400° C. Next, the thermoplastic substrate 100 is cooled. In this embodiment, since the first bend BT1 is formed by thermoplastics, the problem of the circuit board 10 protruding (rebounding) away from the pixel array substrate 30 may be avoided, thereby reducing a vertical distance VD2 (shown in FIG. 8A) between the outer surface of the circuit board 10 and the first side surface 33 of the pixel array substrate 30. In some embodiments, after the thermal compression head H is removed, the circuit board 10 still directly contacts the first side surface 33 of the pixel array substrate 30. In some embodiments, the vertical distance VD2 between the outer surface of the circuit board 10 and the first side surface 33 of the pixel array substrate 30 is less than or equal to 100 micrometers.

In some embodiments, since the rebound problem of the circuit board 10 is avoided, even if the overlapping area between the circuit board 10 and the bonding pad P is reduced, the electrical connection between the circuit board 10 and the bonding pad P will not be disconnected due to the rebound problem. In some embodiments, a side surface 105 (that is, the side surface 105 of the thermoplastic substrate connecting the first surface 103 and the second surface 104) of the circuit board 10 is located above the first surface 31 of the pixel array substrate 30, and a vertical distance VD1 between the side surface 105 of the circuit board 10 and the first side surface 33 of the pixel array substrate 30 is less than or equal to 100 micrometers.

In addition, since the rebound problem of the circuit board 10 is avoided, even if the substrate thickness T2 (for example, the thickness of the glass substrate) of the pixel array substrate 30 is reduced, the pixel array substrate 30 will not be broken due to the rebound of the circuit board 10.

In some embodiments, the thermoplastic substrate 100 includes a liquid crystal polymer substrate, and the liquid crystal polymer substrate includes a plurality of liquid crystal molecules. The long axis direction L (referring to FIG. 1A) of the liquid crystal molecules is parallel to the bending direction of the first bend BT1. Therefore, the problem of the circuit board 10 protruding (rebounding) away from the pixel array substrate 30 may be further avoided.

In this embodiment, the first protective layer 140 and the second protective layer 150 of the circuit board 10 are separated from the first bend BT1 of the thermoplastic substrate 100. Therefore, the problem of the first protective layer 140 and the second protective layer 150 being damaged due to bending may be avoided.

In this embodiment, while forming the first bend BT1, the first conducting pattern 110 and the first oxidation resistant layer 112 are also bent. In this embodiment, the first oxidation resistant layer 112 of the circuit board 10 contacts the first side surface 33 of the pixel array substrate 30, but the disclosure is not limited thereto. In some embodiments, the first oxidation resistant layer 112 is not formed on the surface of the first conducting pattern 110, and the first conducting pattern 110 contacts the first side surface 33 of the pixel array substrate 30.

Figure 8A:
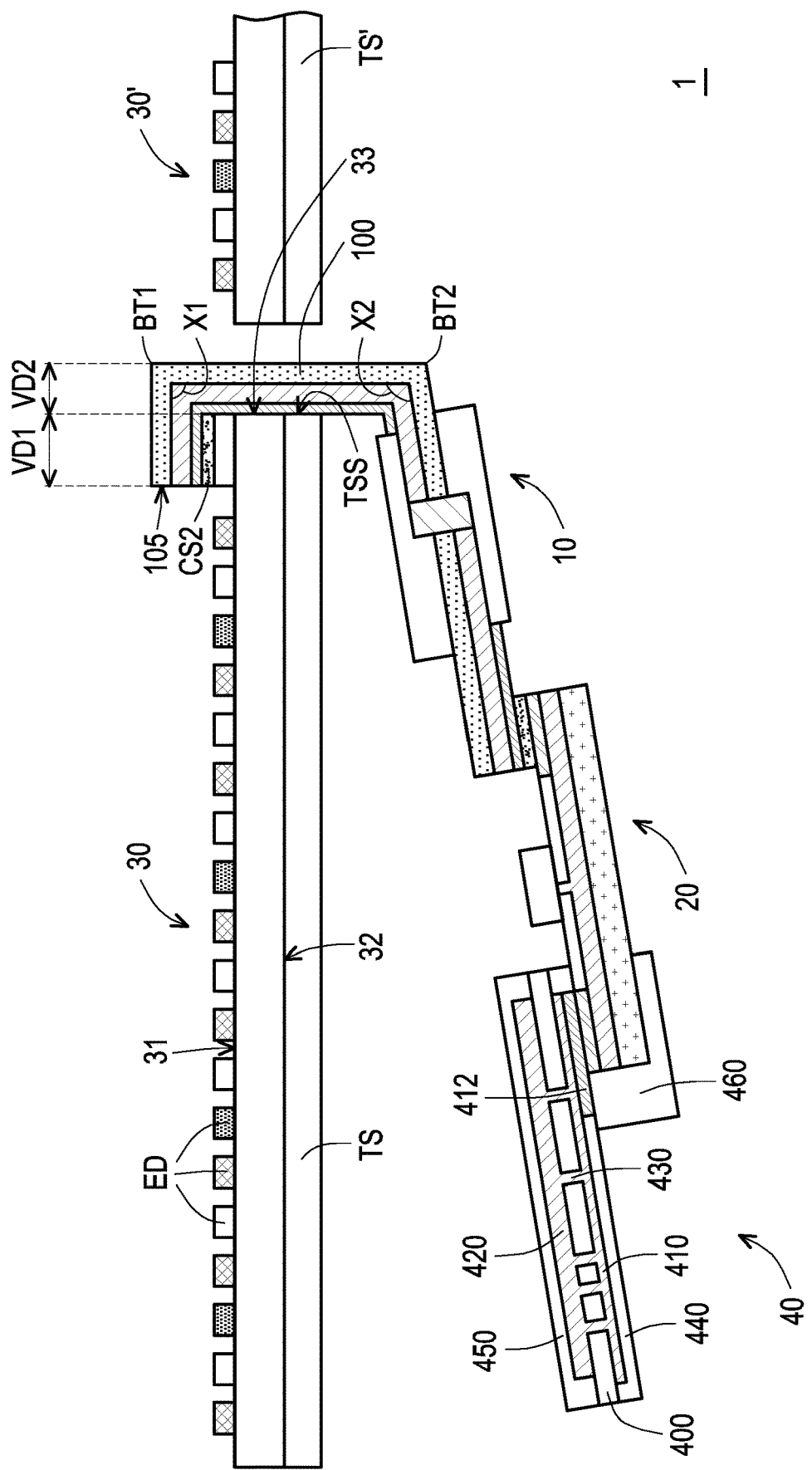
Figure 8B:
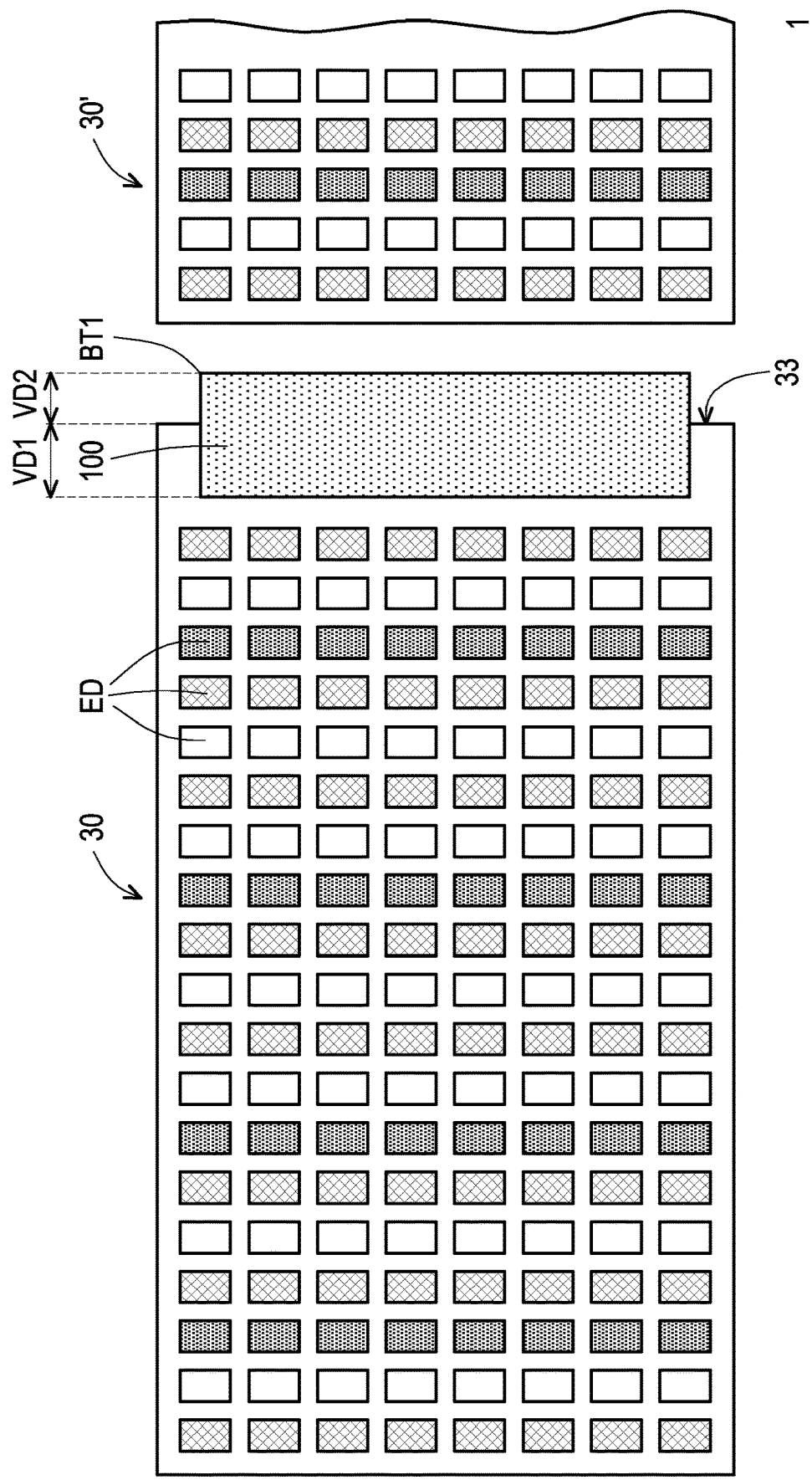
FIG. 8B is a top schematic view of the display device of FIG. 8A.

Next, referring to FIGS. 8A and 8B, the circuit board 10 is bent to form a second bend BT2 on the thermoplastic substrate 100. The second bend BT2 allows the thermoplastic substrate 100 to bend from the first side surface 33 of the pixel array substrate 30 to below the second surface 32.

In this embodiment, the second bend BT2 is not shaped by heating, and the bending angle X1 of the first bend BT1 is smaller than a bending angle X2 of the second bend BT2 or the second bend BT2 includes an arc surface.

In some embodiments, the pixel array substrate 30 is fixed on a splicing carrier TS, and the pixel array substrate 30 and the splicing carrier TS are spliced together with another pixel array substrate 30' and another splicing carrier TS'. In this embodiment, since the thermoplastic substrate 100 has the first bend BT1 formed by thermoplastics, the gap between the circuit board 10 and the first side surface 33 of the pixel array substrate 30 may be reduced, thereby reducing the pitch between the pixel array substrate 30 and said another pixel array substrate 30'. Based on the above, the continuity of the picture displayed by the spliced display device may be improved, and the advantage of seamless splicing may even be derived. In some embodiments, the circuit board 10 directly contacts the first side surface 33 of the pixel array substrate 30 and a second side surface TSS of the splicing carrier TS, but the disclosure is not limited thereto. In some embodiments, the circuit board 10 is separated from the second side surface TSS of the splicing carrier TS.

In some embodiments, the chip package structure 20 is connected to a system board 40. At this point, the display device 1 is roughly completed. The system board 40 includes a substrate 400, a first circuit 410, a second circuit 420, a conductive via 430, a first protective layer 440, a second protective layer 450, an oxidation resistant layer 412, and a plastic cover plate 460.

The substrate 400 is, for example, a glass fiber board. The first circuit 410 and the second circuit 420 are respectively located on opposite sides of the substrate 400. In some embodiments, the first circuit 410 and the second circuit 420 are formed by electroplating. The conductive via 430 is located in the substrate 400 and electrically connects the first circuit 410 and the second circuit 420.

The first protective layer 440 and the second protective layer 450 respectively cover the first circuit 410 and the second circuit 420. The first protective layer 440 exposes a portion of the first circuit 410, and the oxidation resistant layer 412 is formed at the portion of the first circuit 410 which is exposed by the first protective layer 440. The oxidation resistant layer 412 includes, for example, a stacked layer of gold, palladium, nickel/gold or other materials that may prevent oxidation of the first circuit 410.

The plastic cover plate 460 fixes the chip package structure 20 on the oxidation resistant layer 412. For example, the plastic cover plate 460 presses the chip package structure 20 onto the oxidation resistant layer 412, and electrically connects the chip package structure 20 to the oxidation resistant layer 412.

Based on the above, since the circuit board 10 includes the first bend BT1 formed by thermoplastics, the gap between the pixel array substrate 30 and the pixel array substrate 30' may be reduced.

Figure 9:
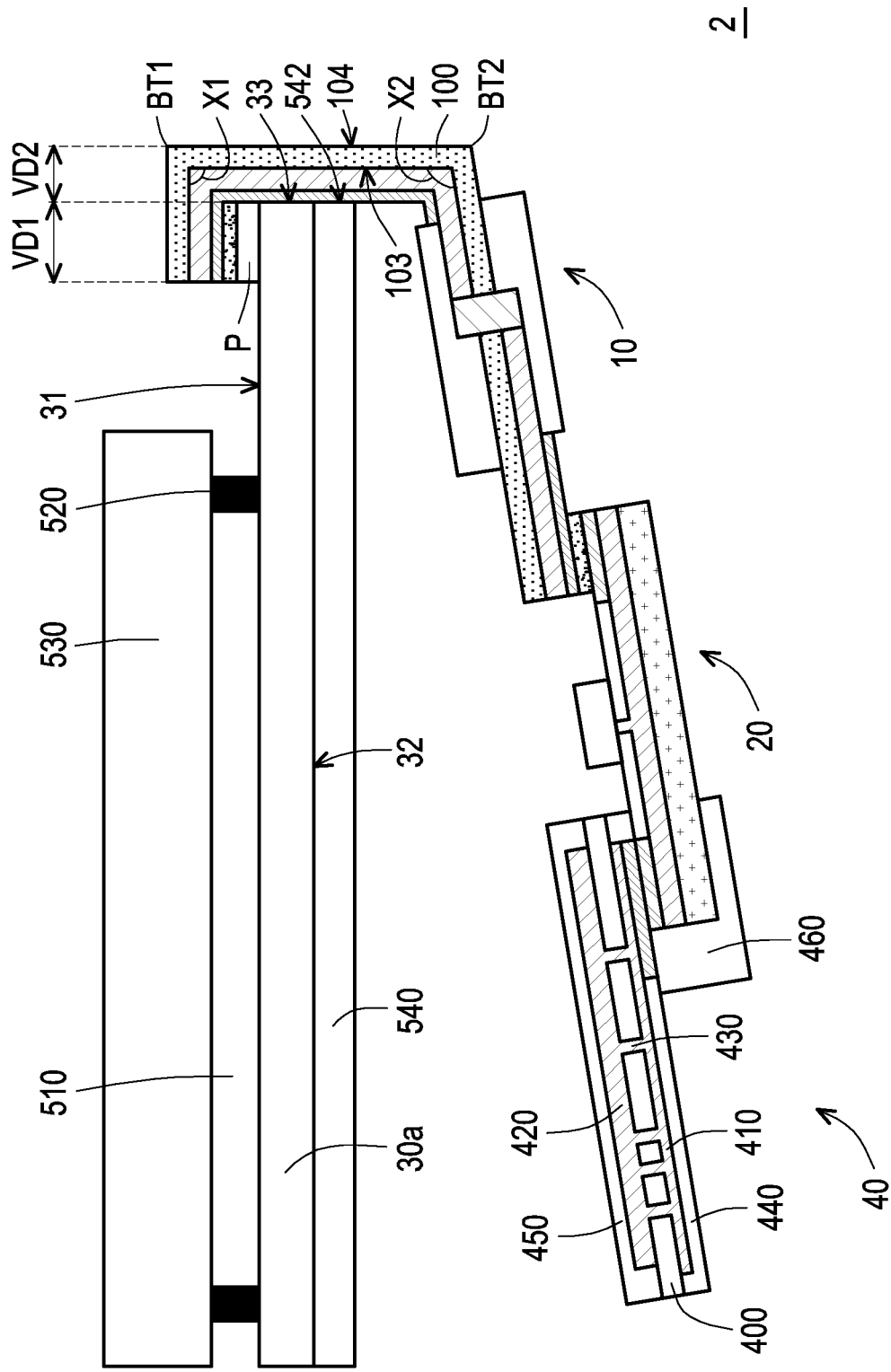
FIG. 9 is a schematic cross-sectional view of a display device according to an embodiment of the disclosure.

FIG. 9 is a schematic cross-sectional view of a display device according to an embodiment of the disclosure. It must be noted here that the embodiment of FIG. 9 uses the reference numerals and a portion of the content of the embodiment of FIGS. 6 to 8A, and the same or similar symbols are used to represent the same or similar elements, and the description of the same technical content is omitted. The aforementioned embodiment may be referred to for the description of the omitted portion, which will not be repeated herein.

Referring to FIG. 9, in this embodiment, a display device 2 is a liquid crystal display device which includes the circuit board 10, the chip package structure 20, a pixel array substrate 30a, the system board 40, a liquid crystal layer 510, a packaging adhesive 520, a filter substrate 530, and a backlight module 540.

The packaging adhesive 510 is located on the pixel array substrate 30a and surrounds the liquid crystal layer 510. The pixel array substrate 30a and the filter substrate 530 are disposed opposite to each other, and the liquid crystal layer 510 is located between the pixel array substrate 30a and the filter substrate 530.

The pixel array substrate 30a has the first surface 31, the second surface 32 opposite to the first surface 31, and the first side surface 33 connecting the first surface 31 and the second surface 32. A plurality of bonding pads P are located on the first surface 31. The circuit board 10 is electrically connected to the bonding pad P, and is bent from above the first surface 31 of the pixel array substrate 30a to below the second surface 32. The circuit board 10 includes the thermoplastic substrate 100. The thermoplastic substrate 100 includes the first surface 103 facing the pixel array substrate 30a and the second surface 104 opposite to the first surface 103. The thermoplastic substrate 100 includes the first bend BT1 formed by thermoplastics. In some embodiments, the circuit board 10 directly contacts the first side surface 33 of the pixel array substrate 30 and a second side surface 542 of the backlight module 540, but the disclosure is not limited thereto. In some embodiments, the circuit board 10 is separated from the second side surface 542 of the backlight module 540.

Based on the above, since the circuit board 10 includes the first bend BT1 formed by thermoplastics, the frame size of the display device 2 may be reduced.

Figure 10:
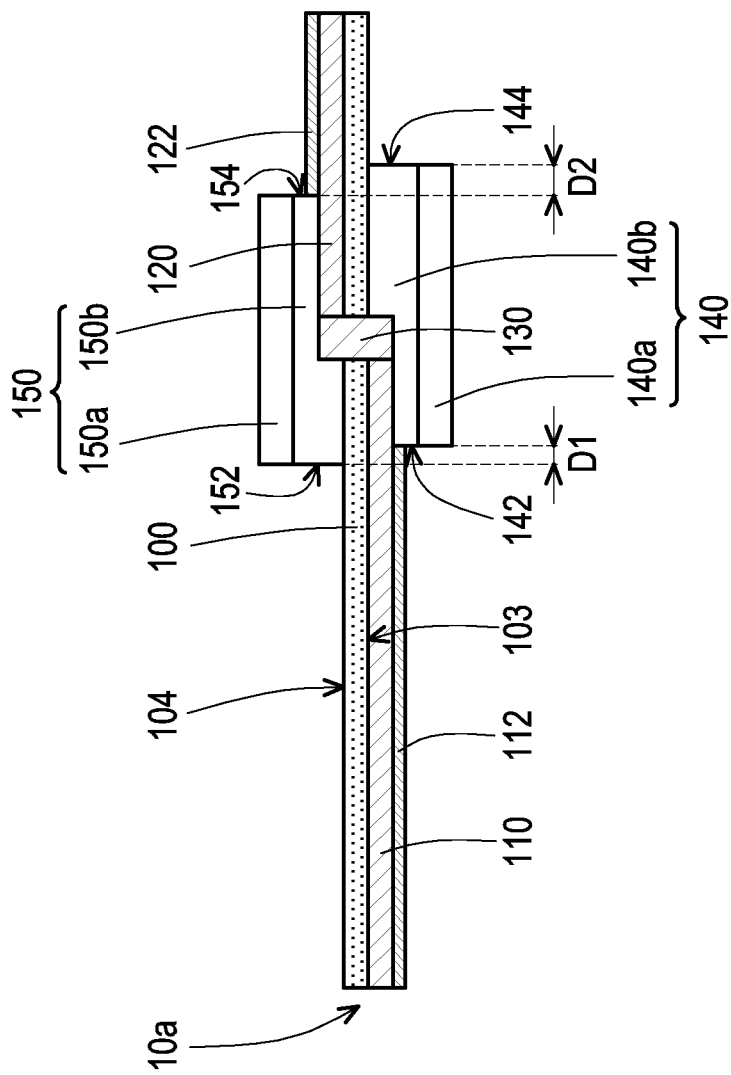
FIG. 10 is a schematic cross-sectional view of a circuit board according to an embodiment of the disclosure.

FIG. 10 is a schematic cross-sectional view of a circuit board according to an embodiment of the disclosure. It must be noted here that the embodiment of FIG. 10 uses the reference numerals and a portion of the content of the embodiment of FIGS. 4A and 4B, and the same or similar symbols are used to represent the same or similar elements, and the description of the same technical content is omitted. The aforementioned embodiment may be referred to for the description of the omitted portion, which will not be repeated herein.

Referring to FIG. 10, in this embodiment, the first protective layer 140 of a circuit board 10a has a double-layer structure, and includes a first insulating layer 140a and a first adhesion layer 140b. The second protective layer 150 of the circuit board 10a has a double-layer structure, and includes a second insulating layer 150a and a second adhesion layer 150b. In this embodiment, the material of the first insulating layer 140a and the second insulating layer 150a includes, for example, polyimide. In some embodiments, polyimide has better stiffness and workability compared with solder resist ink. Therefore, replacing solder resist ink with polyimide may improve the stiffness and workability of the circuit board 10a.

In some embodiments, the horizontal spacing D1 between the side surface 142 of the first protective layer 140 and the side surface 152 of the second protective layer 150 on one side is greater than or equal to 500 micrometers. The horizontal spacing D2 between the side surface 144 of the first protective layer 140 and the side surface 154 of the second protective layer 150 on another side is greater than or equal to 500 micrometers. By allowing the horizontal spacing D1 and the horizontal spacing D2 to be greater than or equal to 500 micrometers, the first conducting pattern 110 and the second conducting pattern 120 may be prevented from breaking due to stress concentration during bending.

In this embodiment, the first protective layer 140 and the second protective layer 150 of the circuit board 10a is avoided to be disposed at the portion (for example, the first bend BT1 in FIG. 7) where the thermoplastic substrate 100 is expected to be bent. Therefore, the problem of the first protective layer 140 and the second protective layer 150 being damaged due to bending may be avoided.

Figure 11:
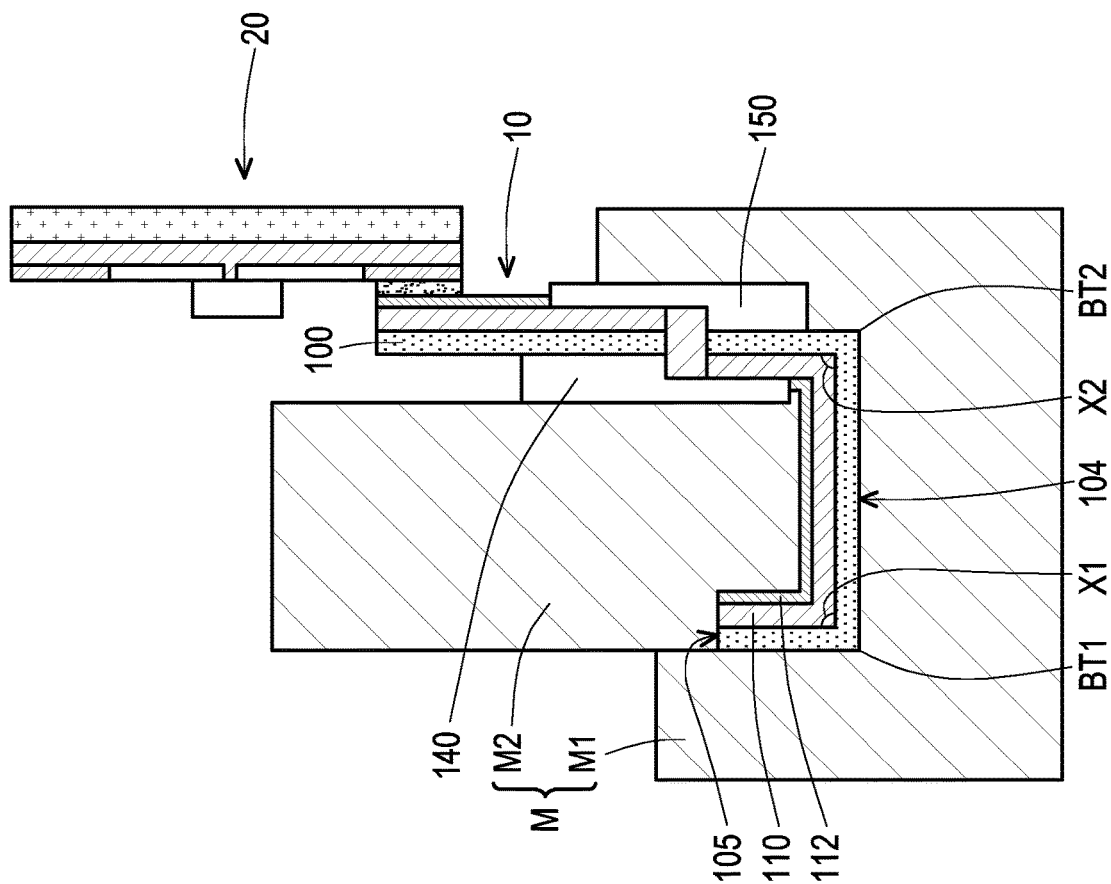
FIGS. 11 to 13 are schematic cross-sectional views of a manufacturing method of a display device according to an embodiment of the disclosure.
Figure 12:
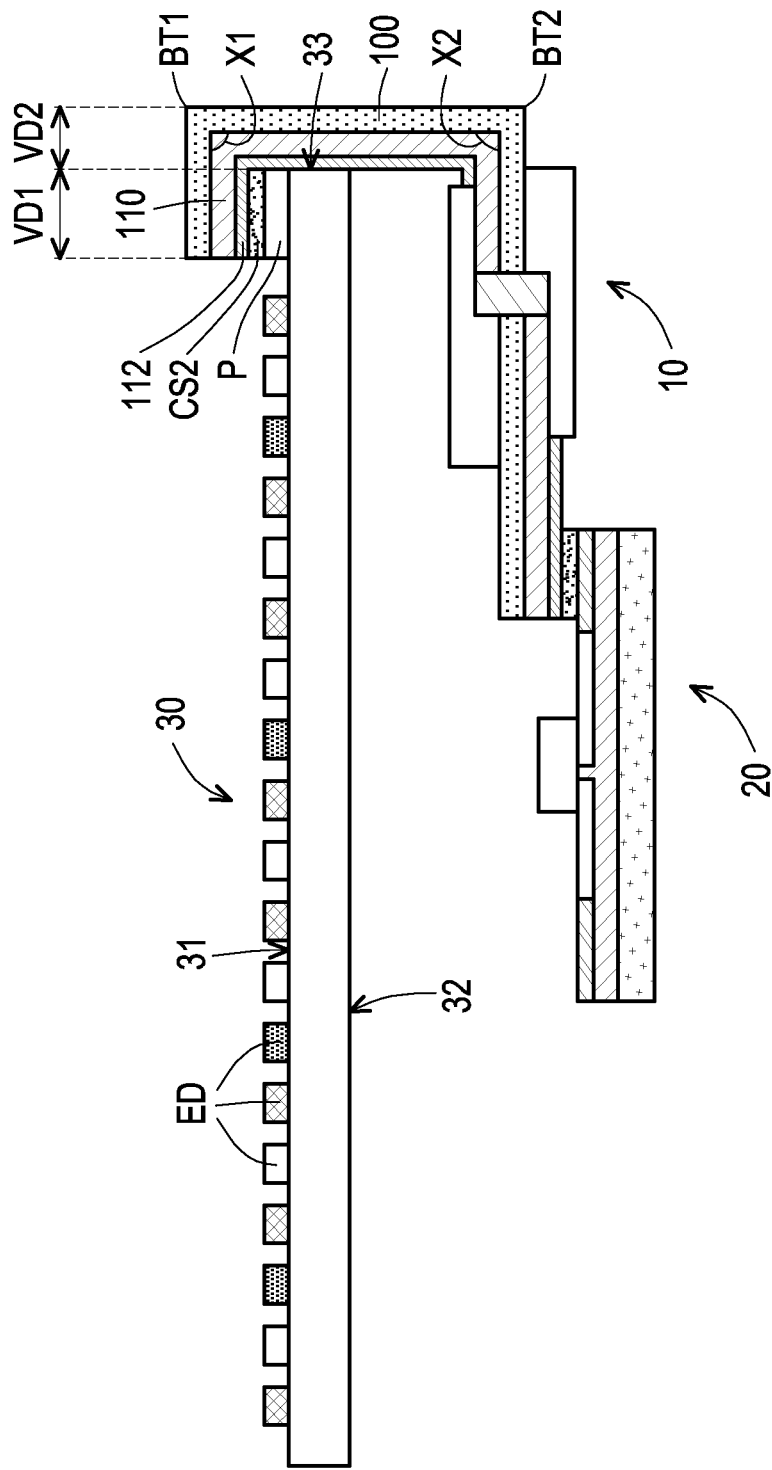
Figure 13:
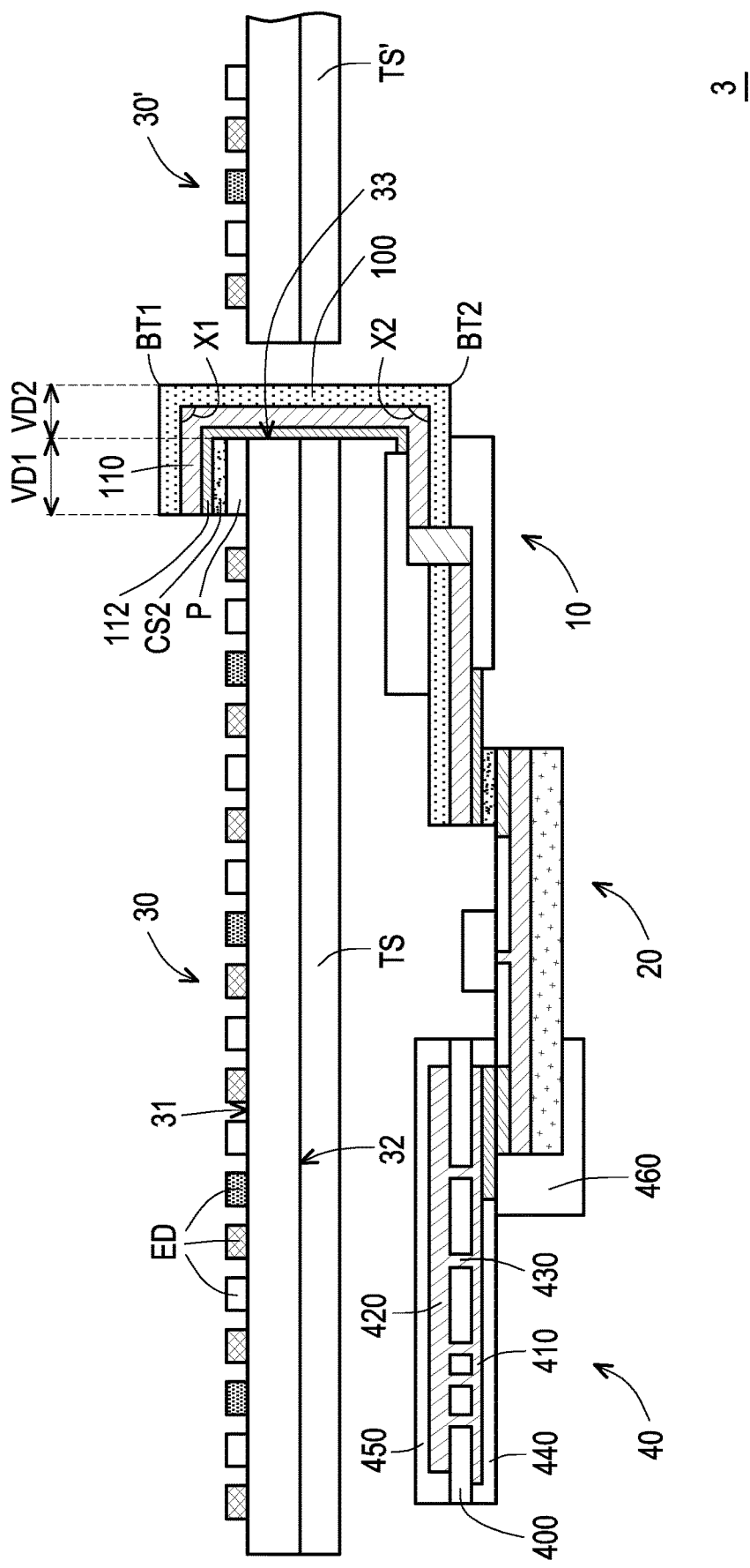

FIGS. 11 to 13 are schematic cross-sectional views of a manufacturing method of a display device according to an embodiment of the disclosure. It must be noted here that the embodiment of FIGS. 11 to 13 uses the reference numerals and a portion of the content of the embodiment of FIGS. 6 to 8A, and the same or similar symbols are used to represent the same or similar elements, and the description of the same technical content is omitted. The aforementioned embodiment may be referred to for the description of the omitted portion, which will not be repeated herein.

Referring to FIG. 11, the circuit board 10 is placed in a mold M, and the thermoplastic substrate 100 of the circuit board 10 is heated with the mold M to form the first bend BT1 formed by thermoplastics in the thermoplastic substrate 100. In some embodiments, the thermoplastic substrate 100 of the circuit board 10 is heated with the mold M, and the first bend BT1 and the second bend BT2 are formed in the thermoplastic substrate 100 at the same time. The bending angle X1 of the first bend BT1 is, for example, 90 degrees to 135 degrees. The bending angle X2 of the second bend BT2 may be the same or different from the bending angle X1 of the first bend BT1. In this embodiment, the chip package structure 20 is connected to the circuit board 10 before the circuit board 10 is placed in the mold M.

In this embodiment, the mold M includes a first portion M1 and a second portion M2. The first portion M1 has a groove, and the second portion M2 is a bump corresponding to the aforementioned groove. In some embodiments, the TYPE-III liquid crystal polymer is used for the thermoplastic substrate 100, and the temperature of the mold M is 100° C. to 350° C.

In this embodiment, first, the circuit board 10 is placed in the first portion M1. Next, the second portion M2 is pressed into the first portion M1 to bend the circuit board 10 into a desired shape. In some embodiments, the mold M contacts one of the side surfaces 105 (that is, the side surface 105 of the thermoplastic substrate) of the circuit board 10. For example, the second portion M2 contacts the side surface 105 of the circuit board 10, thereby allowing the side surface 105 of the circuit board 10 to be formed by thermoplastics. In some embodiments, the side surface 105 is a flat surface before the circuit board 10 is placed in the mold M. After the circuit board 10 is heated with the mold M, the side surface 105 of the circuit board 10 becomes a non-flat surface (such as an arc surface, an oblique surface, or other forms of surfaces). In some embodiments, the bottom surface of the groove of the first portion M1 is a non-flat surface, so that the outer surface (for example, the second surface 104 facing the groove of the first portion M1) of the first bend BT1 and the second bend BT2 of the circuit board 10 is a non-flat surface, such as an arc surface, an oblique surface, or other forms of surfaces.

In some embodiments, the thermoplastic substrate 100 includes a liquid crystal polymer substrate, and the liquid crystal polymer substrate includes a plurality of liquid crystal molecules. The long axis direction L (referring to FIG. 1A) of the liquid crystal molecules is parallel to the bending direction of the first bend BT1 and the second bend BT2. Therefore, the rebound problem of the circuit board 10 after being removed from the mold M may be further avoided.

In this embodiment, the first protective layer 140 and the second protective layer 150 of the circuit board 10 are separated from the first bend BT1 and second bend BT2 of the thermoplastic substrate 100. Therefore, the problem of the first protective layer 140 and the second protective layer 150 being damaged due to bending may be avoided.

In this embodiment, while forming the first bend BT1, the first conducting pattern 110 and the first oxidation resistant layer 112 are also bent.

After heating the thermoplastic substrate 100 with the mold M, the thermoplastic substrate 100 is cooled.

Referring to FIG. 12, the circuit board 10 is electrically connected to the bonding pad P. In this embodiment, the circuit board 10 is electrically connected to the bonding pad P through the second conductive bonding structure CS2. The second conductive bonding structure CS2 is, for example, an anisotropic conductive glue, solder, or other suitable materials.

In this embodiment, since the first bend BT1 is formed by thermoplastics, the problem of the circuit board 10 protruding (rebounding) away from the pixel array substrate 30 may be avoided, thereby reducing the vertical distance VD2 between the outer surface of the circuit board 10 and the first side surface 33 of the pixel array substrate 30. In some embodiments, the vertical distance VD2 between the outer surface of the circuit board 10 and the first side surface 33 of the pixel array substrate 30 is less than or equal to 100 micrometers. In some embodiments, the circuit board 10 directly contacts the first side surface 33 of the pixel array substrate 30. In this embodiment, the first oxidation resistant layer 112 of the circuit board 10 contacts the first side surface 33 of the pixel array substrate 30, but the disclosure is not limited thereto. In some embodiments, the first oxidation resistant layer 112 is not formed on the surface of the first conducting pattern 110, and the first conducting pattern 110 contacts the first side surface 33 of the pixel array substrate 30.

In some embodiments, since the rebound problem of the circuit board 10 is improved, even if the overlapping area between the circuit board 10 and the bonding pad P is reduced, the electrical connection between the circuit board 10 and the bonding pad P will not be disconnected due to the rebound problem. In some embodiments, the side surface 105 (that is, the side surface 105 of the thermoplastic substrate) of the circuit board 10 is located above the first surface 31 of the pixel array substrate 30, and the vertical distance VD1 between the side surface 105 of the circuit board 10 and the first side surface 33 of the pixel array substrate 30 is less than or equal to 100 micrometers.

In addition, since the rebound problem of the circuit board 10 is improved, even if the substrate thickness T2 (for example, the thickness of the glass substrate) of the pixel array substrate 30 is reduced, the pixel array substrate 30 will not be broken due to the rebound of the circuit board 10.

Referring to FIG. 13, the pixel array substrate 30 is fixed on the splicing carrier TS, and the pixel array substrate 30 and the splicing carrier TS are spliced together with another pixel array substrate 30' and another splicing carrier TS'. In this embodiment, since the thermoplastic substrate 100 has the first bend BT1 formed by thermoplastics, the gap between the circuit board 10 and the first side surface 33 of the pixel array substrate 30 may be reduced, thereby reducing the pitch between the pixel array substrate 30 and said another pixel array substrate 30'. Based on the above, the continuity of the picture displayed by the spliced display device may be improved.

In some embodiments, the chip package structure 20 is connected to the system board 40. At this point, a display device 3 is roughly completed.

Figure 14:
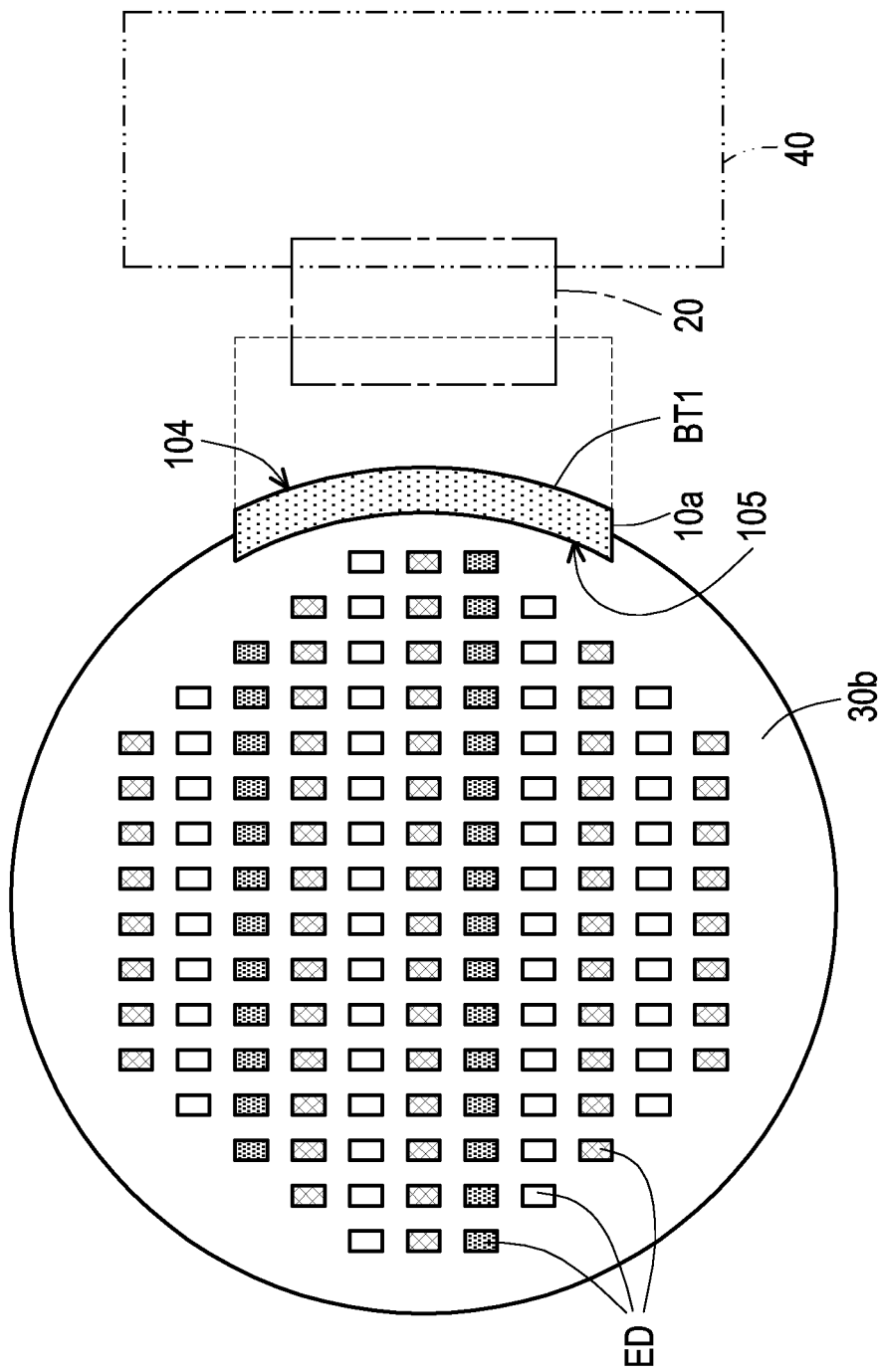
FIG. 14 is a top schematic view of a display device according to an embodiment of the disclosure.

FIG. 14 is a top schematic view of a display device according to an embodiment of the disclosure. It must be noted here that the embodiment of FIG. 14 uses the reference numerals and a portion of the content of the embodiment of FIGS. 11 to 13, and the same or similar symbols are used to represent the same or similar elements, and the description of the same technical content is omitted. The aforementioned embodiment may be referred to for the description of the omitted portion, which will not be repeated herein.

In FIG. 14, the circuit board 10a is bent toward the side surface and the back surface of a pixel array substrate 30b. Therefore, a portion of the circuit board 10a, the chip package structure 20, and the system board 40 are all covered by the pixel array substrate 30b. The portions that are covered as described above are shown by dashed lines in FIG. 14.

Referring to FIG. 14, the substrate of the pixel array substrate 30b is non-rectangular, and may be a circle, an ellipse, a triangle, a trapezoid, a prism, or other geometric shapes. In this embodiment, the substrate of the pixel array substrate 30b is circular.

The circuit board 10a is formed by thermoplastics by the mold M (as shown in FIG. 11), and the side surface 105 of the circuit board 10a becomes a non-flat surface. In this embodiment, the side surface 105 of the circuit board 10a becomes an arc surface corresponding to the edge of the pixel array substrate 30b, thereby reducing the area of the front surface of the pixel array substrate 30b covered by the circuit board 10a. Therefore, the pixel array substrate 30b may have a larger display area.

The circuit board 10a includes the first bend BT1 formed by thermoplastics. In this embodiment, the outer surface (for example, the second surface 104 away from the pixel array substrate 30b) of the first bend BT1 is an arc surface. In this way, the circuit board 10a conforms to the shape of the edge of the pixel array substrate 30b.

The circuit board 10a is electrically connected to the chip package structure 20. The chip package structure 20 is electrically connected to the system board 40.

Figure 15:
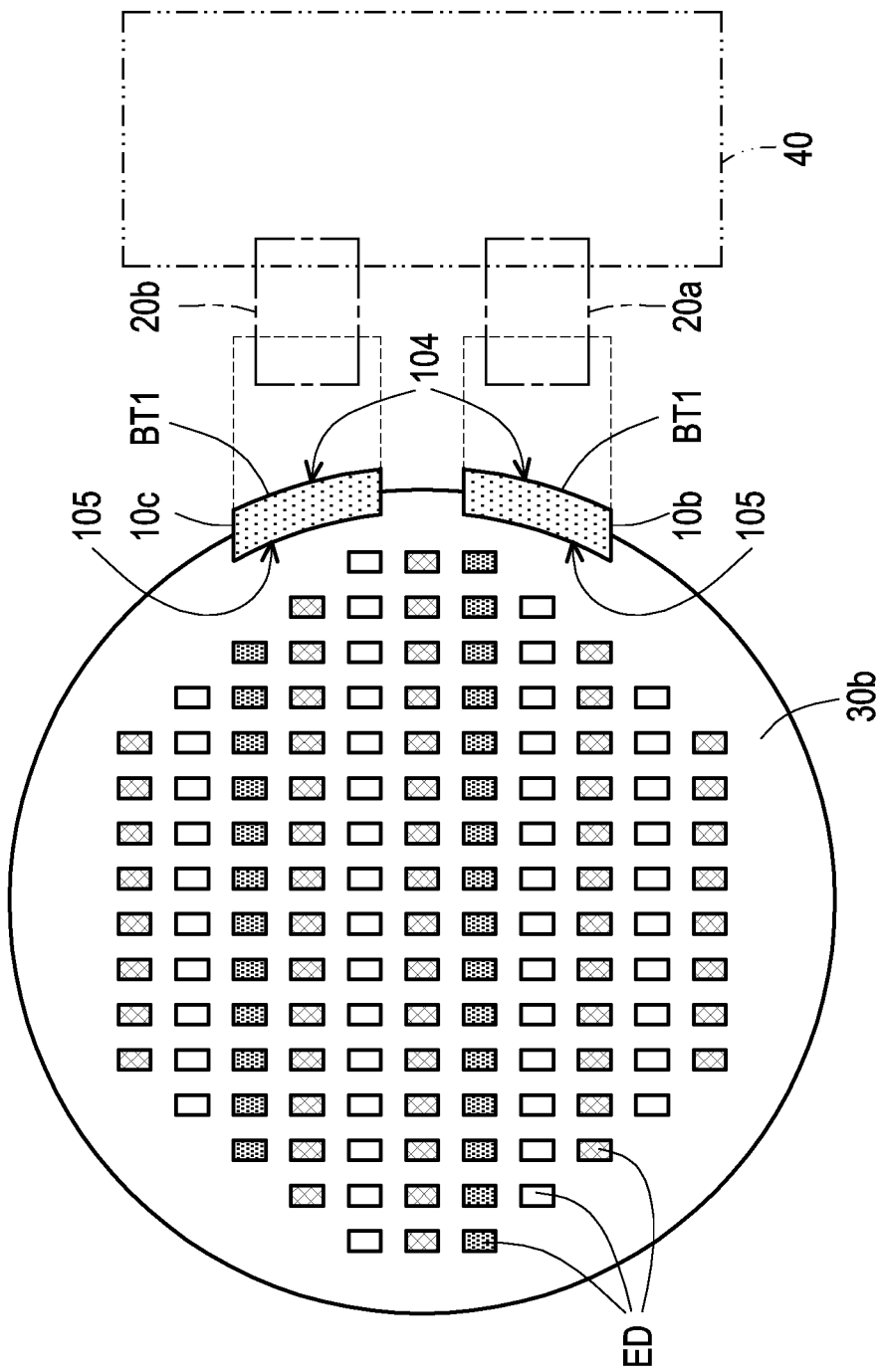
FIG. 15 is a top schematic view of a display device according to an embodiment of the disclosure.

FIG. 15 is a top schematic view of a display device according to an embodiment of the disclosure. It must be noted here that the embodiment of FIG. 15 uses the reference numerals and a portion of the content of the embodiment of FIG. 14, and the same or similar symbols are used to represent the same or similar elements, and the description of the same technical content is omitted. The aforementioned embodiment may be referred to for the description of the omitted portion, which will not be repeated herein.

In FIG. 15, circuit boards 10b and 10c are bent toward the side surface and the back surface of the pixel array substrate 30b. Therefore, a portion of the circuit boards 10b and 10c, chip package structures 20a and 20b, and the system board 40 are all covered by the pixel array substrate 30b. The portions that are covered as described above are shown by dashed lines in FIG. 15.

Referring to FIG. 15, in this embodiment, the pixel array substrate 30b is electrically connected to a plurality of circuit boards 10b and 10c.

The circuit boards 10b and 10c are formed by thermoplastics by the mold M (as shown in FIG. 11), and the side surfaces 105 of the circuit boards 10b and 10c become non-flat surfaces. In this embodiment, the side surfaces 105 of the circuit boards 10b and 10c become arc surfaces corresponding to the edge of the pixel array substrate 30b, thereby reducing the area of the front surface of the pixel array substrate 30b covered by the circuit boards 10b and 10c. Therefore, the pixel array substrate 30b may have a larger display area.

The circuit boards 10b and 10c respectively include the first bend BT1 formed by thermoplastics. In this embodiment, the outer surface (for example, the second surface 104 away from the pixel array substrate 30b) of the first bend BT1 is an arc surface. In this way, the circuit boards 10b and 10c conform to the shape of the edge of the pixel array substrate 30b.

The circuit boards 10b and 10c are respectively electrically connected to the chip package structures 20a and 20b. The chip package structures 20a and 20b are electrically connected to the system board 40.

In summary, since the first bend of the circuit board is formed by thermoplastics, the problem of the circuit board rebounding away from the pixel array substrate may be avoided.

What is claimed is:

1. A display device, comprising:
   a pixel array substrate, having a first surface, a second surface opposite to the first surface, and a first side surface connecting the first surface and the second surface, wherein a plurality of bonding pads are located on the first surface; and
   a circuit board, electrically connected to the bonding pads, bent from above the first surface of the pixel array substrate to below the second surface, wherein the circuit board comprises a thermoplastic substrate, wherein the thermoplastic substrate comprises a third surface facing the pixel array substrate and a fourth surface opposite to the third surface, and the thermoplastic substrate comprises a first bend formed by thermoplastics.

2. The display device according to claim 1, wherein the circuit board further comprises:
   a first conducting pattern, located on the third surface, electrically connected to the bonding pads;
   a second conducting pattern, located on the fourth surface; and
   a plurality of electric conductive vias, penetrating the thermoplastic substrate, electrically connecting the first conducting pattern to the second conducting pattern.

3. The display device according to claim 2, wherein the circuit board further comprises:
   a first protective layer, located on the first conducting pattern; and
   a second protective layer, located on the second conducting pattern, wherein the first protective layer and the second protective layer are separated from the first bend of the thermoplastic substrate.

4. The display device according to claim 3, wherein a horizontal spacing between a side surface of the first protective layer and a side surface of the second protective layer on one side is greater than or equal to 500 micrometers.

5. The display device according to claim 1, wherein a Young's modulus of the first bend of the thermoplastic substrate is 3 GPa to 5 GPa.

6. The display device according to claim 1, wherein a glass transition temperature of the thermoplastic substrate is 145° C. to 165° C.

7. The display device according to claim 1, wherein a thickness of the thermoplastic substrate is 25 micrometers to 50 micrometers.

8. The display device according to claim 1, wherein the circuit board directly contacts the first side surface of the pixel array substrate.

9. The display device according to claim 1, further comprising:
a backlight module, located on the second surface of the pixel array substrate, wherein the circuit board directly contacts a second side surface of the backlight module.

10. The display device according to claim 1, wherein the thermoplastic substrate comprises a liquid crystal polymer substrate.

11. The display device according to claim 10, wherein the liquid crystal polymer substrate comprises a plurality of liquid crystal molecules, and a long axis direction of the liquid crystal molecules is parallel to a bending direction of the first bend.

12. The display device according to claim 1, wherein the thermoplastic substrate further comprises a second bend, wherein the first bend allows the thermoplastic substrate to bend from above the first surface of the pixel array substrate to the first side surface of the pixel array substrate, the second bend allows the thermoplastic substrate to bend from the first side surface of the pixel array substrate to below the second surface of the pixel array substrate, and a bending angle of the first bend is smaller than a bending angle of the second bend or the second bend comprises an arc surface.

13. The display device according to claim 12, further comprising:
a chip package structure, electrically connected to the circuit board, wherein the chip package structure comprises:
a substrate;
a circuit, located on the substrate; and
at least one chip, electrically connected to the circuit.

14. The display device according to claim 1, wherein the thermoplastic substrate comprises a side surface connecting the third surface and the fourth surface, wherein the side surface is located above the first surface of the pixel array substrate, and the side surface is not a flat surface.

15. A manufacturing method of a display device, comprising:
providing a pixel array substrate, wherein the pixel array substrate has a first surface, a second surface opposite to the first surface, and a first side surface connecting the first surface and the second surface, wherein a plurality of bonding pads are located on the first surface;
providing a circuit board, wherein the circuit board comprises a thermoplastic substrate:
heating the thermoplastic substrate to form a first bend formed by thermoplastics in the thermoplastic substrate; and
electrically connecting the circuit board to the bonding pads.

16. The manufacturing method of the display device according to claim 15, wherein a method of providing the circuit board comprises:
forming the thermoplastic substrate;
forming the first conducting pattern on the third surface of the thermoplastic substrate;
forming the second conducting pattern on the fourth surface of the thermoplastic substrate;
forming a plurality of vias in the thermoplastic substrate;
forming a conductive material in the vias to form a plurality of electric conductive vias, wherein the electric conductive vias electrically connect the first conducting pattern to the second conducting pattern;
forming a first protective layer on the first conducting pattern; and
forming a second protective layer on the second conducting pattern, wherein the first protective layer and the second protective layer are separated from the first bend of the thermoplastic substrate.

17. The manufacturing method of the display device according to claim 15, wherein after electrically connecting the circuit board to the bonding pads, the circuit board is bent from the first surface of the pixel array substrate to the first side surface of the pixel array substrate, and then the step of heating the thermoplastic substrate is performed by using a thermal compression head.

18. The manufacturing method of the display device according to claim 17, further comprising:
bending the circuit board to form a second bend in the thermoplastic substrate, wherein the first bend allows the thermoplastic substrate to bend from above the first surface of the pixel array substrate to the first side surface of the pixel array substrate, and the second bend allows the thermoplastic substrate to bend from the first side surface of the pixel array substrate to below the second surface of the pixel array substrate, wherein a bending angle of the first bend is smaller than a bending angle of the second bend or the second bend comprises an arc surface.

19. The manufacturing method of the display device according to claim 15, wherein before electrically connecting the circuit board to the bonding pads, the circuit board is placed in a mold, and the step of heating the thermoplastic substrate is performed by using the mold.

20. The manufacturing method of the display device according to claim 19, wherein the mold heats a side surface of the thermoplastic substrate and allows the side surface to be formed by thermoplastics.

* * * * *